United States Patent
Aoyagi (10) Patent No.: US 7,226,808 B2
(45) Date of Patent: Jun. 5, 2007

(54) METHOD OF MANUFACTURING SEMICONDUCTOR DEVICE AND METHOD OF MANUFACTURING ELECTRONICS DEVICE

(75) Inventor: Akiyoshi Aoyagi, Sagamihara (JP)

(73) Assignee: Seiko Epson Corporation, Tokyo (JP)

( * ) Notice: Subject to any disclaimer, the term of this patent is extended or adjusted under 35 U.S.C. 154(b) by 122 days.

(21) Appl. No.: 10/833,947

(22) Filed: Apr. 28, 2004

(65) Prior Publication Data

US 2005/0003587 A1    Jan. 6, 2005

(30) Foreign Application Priority Data

May 2, 2003    (JP) .............................. 2003-127058

(51) Int. Cl.
*H01L 21/00*    (2006.01)
(52) U.S. Cl. ...................... 438/108; 438/107; 438/109; 438/118; 438/119
(58) Field of Classification Search ........ 438/107–109, 438/118–119
See application file for complete search history.

(56) References Cited

U.S. PATENT DOCUMENTS 5,323,060 A * 6/1994 Fogal et al. ................ 257/777
6,025,648 A * 2/2000 Takahashi et al. .......... 257/778
6,190,940 B1 * 2/2001 DeFelice et al. ............ 438/106
6,239,496 B1 * 5/2001 Asada ........................ 257/777
6,489,676 B2   12/2002 Taniguchi et al. .......... 257/698
6,784,530 B2 * 8/2004 Sugaya et al. .............. 257/686
6,828,665 B2 * 12/2004 Pu et al. ..................... 257/686
6,870,269 B2 * 3/2005 Derderian ................... 257/777

FOREIGN PATENT DOCUMENTS

| JP | 10-294423 | 11/1998 |
| JP | 2000-252419 | 9/2000 |
| JP | 2001-044362 | 2/2001 |
| JP | 2002-026244 | 1/2002 |
| JP | 2002-170906 | 6/2002 |
| JP | 2003318361 | 11/2003 |

* cited by examiner

*Primary Examiner*—Zandra V. Smith
*Assistant Examiner*—Bac H. Au
(74) *Attorney, Agent, or Firm*—Hogan & Hartson LLP (57) ABSTRACT

A method of manufacturing a semiconductor device includes providing resin on at least a partial area on a first semiconductor package and coupling a second semiconductor package to the first semiconductor package electrically while the resin maintains its fluidity.

11 Claims, 6 Drawing Sheets

METHOD OF MANUFACTURING SEMICONDUCTOR DEVICE AND METHOD OF MANUFACTURING ELECTRONICS DEVICE

BACKGROUND OF THE INVENTION

1. Field of the Invention

The present invention relates to a method of manufacturing a semiconductor device and a method of manufacturing an electronic device, and especially relates to methods that are preferably applied to a stack structure of semiconductor packages.

2. Description of the Related Art

In a conventional semiconductor package, space-saving has been attempted by stacking semiconductor packages through solder balls. In this method, resin is filled between the stacked semiconductor packages.

In a conventional semiconductor package, however, resin is filled into the entire gap between semiconductor packages stacked through solder balls. Thus, when the resin filled between the semiconductor packages is cured, water contained in the resin is not sufficiently removed such that some water remains in the resin filled between the semiconductor packages. This causes a problem that, when a reflow process is implemented during a secondary mounting of the stacked semiconductor packages, water contained in the resin filled between the semiconductor packages evaporates and expands such that the separation between the semiconductor packages occurs.

Furthermore, in a conventional semiconductor package, resin is filled between semiconductor packages after the semiconductor packages have been fixed to each other through solder balls. It is therefore difficult to fill resin into only a particular position between semiconductor packages if the gap between the semiconductor packages is narrow. This causes problems that the resin gets in contact with solder balls so as to cause thermal damage to the resin and the resin can not be disposed in consideration of stress applied to the semiconductor packages.

Meanwhile, if semiconductor packages are secured to each other with resin before the semiconductor packages are fixed to each other through the solder balls, the semiconductor packages get stuck when the solder balls are reflowed. As a result, there has been a problem that self-alignment of the semiconductor packages by the surface tension of the solder balls when melted is prevented such that the placement accuracy of the semiconductor packages is degraded.

In view of the above problems, the present invention is intended to provide a method of manufacturing a semiconductor device and a method of manufacturing an electronic device that can easily adjust the placement position of resin between semiconductor packages without degrading the placement accuracy of semiconductor packages.

SUMMARY OF THE INVENTION

In order to solve these problems, a method of manufacturing a semiconductor device according to one aspect of the present invention includes the steps of providing resin on at least a partial area on a first semiconductor package, and coupling a second semiconductor package to the first semiconductor package electrically while the resin maintains fluidity.

This enables the second semiconductor package to be disposed above the first semiconductor package after the resin is disposed on the first semiconductor package such that the placement position of the resin between the first and second semiconductor packages can easily be adjusted. Thus, even in the case where the gap between the first and second semiconductor packages is narrow, the resin can be disposed between the first and second semiconductor packages avoiding a solder material, while the resin can be provided between the first and second semiconductor packages with ensuring channels for letting out water contained in the resin. As a result, the separation between the first and second semiconductor packages can be avoided while thermal damage of the resin is suppressed. In addition, the first and second semiconductor packages can be secured to each other with the resin, enabling the displacement between the first and second semiconductor packages to be avoided even in the case where a reflow process is implemented during a second mounting.

Furthermore, even in the case where the resin is disposed on the first semiconductor package before the second semiconductor package is disposed above the first semiconductor package, the fluidity of the resin provided between the first and second semiconductor packages can be maintained when the second semiconductor package is electrically coupled to the first semiconductor package. Thus, even in the case where a solder material is used for electrically coupling the second semiconductor package to the first semiconductor package, self-alignment by the surface tension of solder when melted can be utilized, enabling the second semiconductor package to be precisely disposed above the first semiconductor package.

A method of manufacturing a semiconductor device according to one aspect of the present invention includes the steps of providing resin on at least a part of a first semiconductor chip mounted on a first semiconductor package, and coupling a second semiconductor package where a second semiconductor chip is mounted to the first semiconductor package electrically while the resin maintains fluidity.

According to this method, even in the case where the gap between the first and second semiconductor packages is narrow, the resin can be disposed between the first and second semiconductor packages avoiding a solder material, while the resin can be provided between the first and second semiconductor packages with ensuring channels for letting out water contained in the resin. As a result, the separation between the first and second semiconductor packages can be avoided while thermal damage of the resin is suppressed. In addition, the first and second semiconductor packages can be secured to each other with the resin, enabling the displacement between the first and second semiconductor packages to be avoided even in the case where a reflow process is implemented during a second mounting.

In addition, even in the case where a solder material is used for electrically coupling the second semiconductor package to the first semiconductor package, the second semiconductor package can move above the first semiconductor package, and thereby self-alignment by the surface tension of solder when melted can be utilized.

A method of manufacturing a semiconductor device according to one aspect of the present invention includes the steps of providing resin on at least a partial area of a first semiconductor package where a first semiconductor chip is mounted, and coupling a second semiconductor package where a second semiconductor chip is mounted to the first semiconductor package electrically so that the second semiconductor package is disposed above the first semiconductor chip while maintaining the fluidity of the resin.

According to this, even in the case where the types of the first and second semiconductor packages are different from each other, the separation between the first and second semiconductor packages can be avoided while the displacement of the stacked semiconductor packages during a secondary mounting is prevented. Furthermore, the second semiconductor package can precisely be disposed above the first semiconductor package such that the reliability of connection between the first and second semiconductor packages can be improved while space-saving is achieved.

A method of manufacturing a semiconductor device according to one aspect of the present invention includes the steps of providing resin on at least a partial area of a first semiconductor package where a first semiconductor chip is mounted, and coupling a second semiconductor package where a second semiconductor chip is mounted to the first semiconductor package electrically so that an end part of the second semiconductor package is disposed above the first semiconductor chip while maintaining the fluidity of the resin.

According to this, the second semiconductor package can precisely be disposed above the first semiconductor package, and the plurality of semiconductor packages can be disposed above one first semiconductor chip. In addition, the separation between the first and second semiconductor packages can be avoided while the displacement of the stacked semiconductor packages during a secondary mounting is prevented. Thus, the reliability of connection between the first and second packages can be improved while the mounting area can be further reduced.

In the method of manufacturing a semiconductor device according to one aspect of the present invention, the first and second semiconductor packages are electrically coupled to each other through a solder ball.

This enables the first and second semiconductor packages to be electrically coupled to each other with the reflow process. The second semiconductor package therefore can effectively be mounted on the first semiconductor package.

In the method of manufacturing a semiconductor device according to one aspect of the present invention, the state where the resin maintains fluidity is either of an A-stage state or a B-stage state.

Thus, the fluidity of the resin can be maintained at room temperature, while fluidity can be provided to the resin by heating. The second semiconductor package therefore can be coupled to the first semiconductor package electrically without preventing self-alignment by the surface tension of solder when melted.

The method of manufacturing a semiconductor device according to one aspect of the present invention further includes the step of transforming the resin into a C-stage state after the second semiconductor package is electrically coupled to the first semiconductor package.

This enables the resin to be cured after the second semiconductor package is electrically coupled to the first semiconductor package such that the second semiconductor package can be fixed above the first semiconductor package with the resin without preventing self-alignment by the surface tension of solder when melted.

A method of manufacturing an electronic device according to one aspect of the present invention includes the steps of providing resin on at least a partial area of a first package where a first electronic component is mounted, and coupling a second package where a second electronic component is mounted to the first package electrically while the resin maintains fluidity.

This enables the second package to be disposed above the first package after the resin is disposed on the first package such that the placement position of the resin between the first and second packages can easily be adjusted. Thus, even in the case where the gap between the first and second packages is narrow, the resin can be disposed between the first and second packages avoiding a solder material, while the resin can be provided between the first and second packages with ensuring channels for letting out water contained in the resin. As a result, the separation between the first and second packages can be avoided while thermal damage of the resin is suppressed. In addition, the first and second packages are secured to each other with the resin, enabling the displacement between the first and second packages to be avoided even in the case where the reflow process is implemented during the second mounting.

Furthermore, even in the case where the resin is disposed on the first package before the second package is disposed above the first package, the fluidity of the resin provided between the first and second packages can be maintained when the second package is electrically coupled to the first package. Thus, even in the case where a solder material is used for electrically coupling the second package to the first package, self-alignment by the surface tension of solder when melted can be utilized, enabling the second package to be precisely disposed above the first package.

DESCRIPTION OF THE PREFERRED EMBODIMENTS

A semiconductor device and a method of manufacturing the same according to embodiments of the present invention will be described below with reference to the accompanying drawings.

Figure 1:
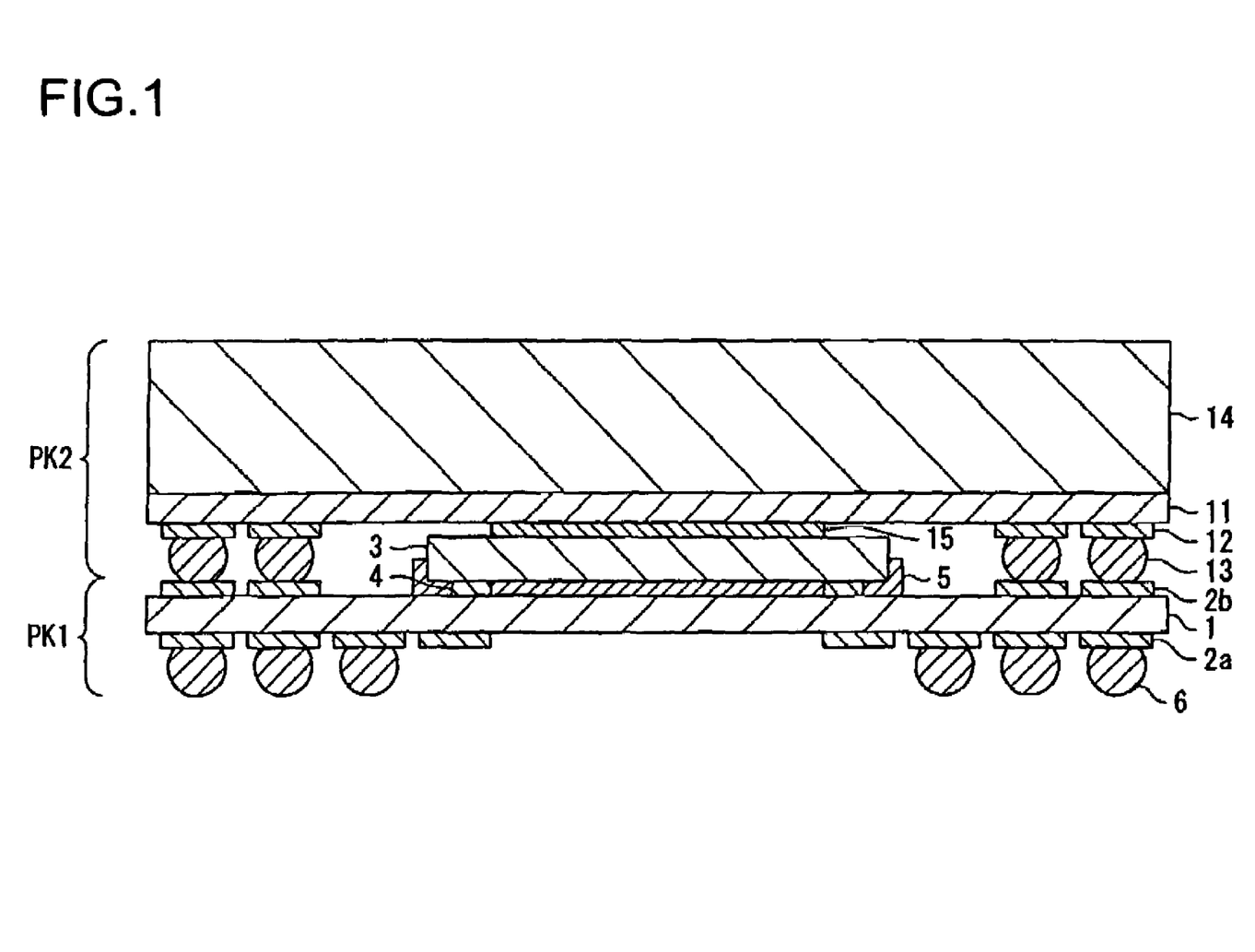
FIG. 1 is a sectional view schematically showing a structure of a semiconductor device according to a first embodiment of the present invention.

FIG. 1 is a sectional view schematically showing a structure of a semiconductor device according to a first embodiment of the present invention.

Referring to FIG. 1, a semiconductor package PK1 includes a carrier substrate 1, and on both sides of the carrier substrate 1 are formed lands 2a and 2b, respectively. A semiconductor chip 3 is flip-chip mounted on the carrier substrate 1. Protruding electrodes 4 for flip-chip mounting are provided on the semiconductor chip 3. The protruding electrodes 4 provided on the semiconductor chip 3 are bonded to the lands 2b through an anisotropic conductive sheet 5 by Anisotropic Conductive Film (ACF) bonding.

Meanwhile, a semiconductor package PK2 includes a carrier substrate 11. Lands 12 are formed on a back surface of the carrier substrate 11, and protruding electrodes 13 are provided on the lands 12. A semiconductor chip is mounted on the carrier substrate 11. The carrier substrate 11, where the semiconductor chip is mounted, is sealed with a sealing resin 14. Here, the semiconductor chip may be mounted by wire bonding, or may be mounted by flip-chip mounting, on the carrier substrate 11. Otherwise, a stack structure of semiconductor chips may be mounted.

The protruding electrodes 13 are bonded to the lands 2b provided on the carrier substrate 1, and thereby the semiconductor package PK2 is mounted on the semiconductor package PK1 so that the carrier substrate 11 is disposed above the semiconductor chip 3.

Furthermore, resin 15 is provided on the semiconductor chip 3 so that at least a part of the semiconductor chip 3 is exposed. The semiconductor package PK2 is secured to the semiconductor chip 3 through the resin 15. As the resin 15, either of a resin paste or a resin sheet may be used.

This enables the semiconductor packages PK1 and PK2 to be fixed to each other through the resin 15 disposed on the semiconductor chip 3, and enables the gap between the semiconductor packages PK1 and PK2 to be left even though the resin 15 is provided between the semiconductor packages PK1 and PK2. Thus, water contained in the resin between the semiconductor packages PK1 and PK2 can easily be removed such that the expansion of the resin 15 between the semiconductor packages PK1 and PK2 can be avoided even in the case where protruding electrodes 6 are reflowed during a secondary mounting. As a result, the semiconductor packages PK1 and PK2 can be secured to each other with the resin 15 while the separation between the semiconductor packages PK1 and PK2 can be avoided, enabling the displacement between the semiconductor packages PK1 and PK2 to be avoided.

In the case where the resin 15 is provided on the semiconductor chip 3 so that at least a part of the semiconductor chip 3 is exposed, the resin 15 can be disposed on the semiconductor chip 3 before the semiconductor packages PK1 and PK2 are electrically coupled to each other through the protruding electrodes 13. In addition, when the semiconductor packages PK1 and PK2 are electrically coupled to each other through the protruding electrodes 13, the resin 15 disposed on the semiconductor chip 3 is preferably maintained at an A-stage state (a state where the resin is softened due to temperature rising), or a B-stage state (a state where the viscosity of the resin increases due to temperature rising).

Thus, even in the case where the resin 15 is disposed on the semiconductor chip 3 before the semiconductor package PK2 is disposed above the semiconductor package PK1, the fluidity of the resin 15 provided between the semiconductor packages PK1 and PK2 can be maintained when the semiconductor package PK2 is electrically coupled to the semiconductor package PK1 through the protruding electrodes 13. Self-alignment by the surface tension of solder when melted therefore can be utilized when solder balls are used as the protruding electrodes 13, enabling the semiconductor package PK2 to be precisely disposed above the semiconductor package PK1.

The resin 15 may be provided only on facing surfaces of the semiconductor package PK2 and the semiconductor chip 3. This enables the semiconductor packages PK1 and PK2 to be effectively secured to each other through the resin 15 provided on the semiconductor chip 3 without bringing the semiconductor package PK1 into contact with the resin 15.

Thus, the displacement between the semiconductor packages PK1 and PK2, which are stacked, during the secondary mounting can be avoided while the separation between the semiconductor packages PK1 and PK2 can be avoided.

The resin 15 may be provided on the center part of the semiconductor chip 3. This enables the resin 15 to be disposed on a place distant from the protruding electrodes 13 even though the semiconductor packages PK1 and PK2 are electrically coupled to each other through the protruding electrodes 13. Thus, the expansion and contraction of the resin 15 can be prevented from imposing a negative effect on the protruding electrodes 13, enabling the endurance for temperature cycling and the like to be improved.

The modulus of elasticity of the resin 15 provided between the semiconductor chip 3 and the semiconductor package PK2 is preferably smaller than that of the anisotropic conductive sheet 5 provided between the semiconductor chip 3 and the carrier substrate 1. This enables the resin 15 to effectively absorb the shock imposed on the semiconductor chip 3. The shock-resistance of the semiconductor chip 3 therefore can be improved such that the semiconductor packages PK1 and PK2 can be stacked while the reliability of the semiconductor chip 3 is secured.

Fillers such as silica and alumina may be mixed into the resin 15. This enables the viscosity of the resin 15 to be easily controlled such that dropping of the resin 15 can be avoided, and the area where the resin 15 is provided can easily be controlled.

The resin 15 on the semiconductor chip 3 may be disposed on only one place. Otherwise, the resin 15 may be disposed on the semiconductor chip 3 in a dispersed manner. By disposing the resin 15 on the semiconductor chip 3 in a dispersed manner, channels for letting out water contained in the resin 15 can be ensured on the semiconductor chip 3. Water contained in the resin 15 therefore can be reduced even in the case where the gap between the semiconductor chip 3 and the semiconductor package PK2 is narrow.

As the carrier substrates 1 and 11, for example, a double-sided substrate, a multi-layered wiring substrate, a build-up substrate, a tape substrate, or a film substrate can be used. As the material of the carrier substrates 1 and 11, for example, polyimide resin, glass epoxy resin, BT resin, a composite of aramid and epoxy, or ceramic can be used. Meanwhile, as the protruding electrodes 4, 6, and 13, for example, a Au bump, a Cu bump or Ni bump covered by a solder material and the like, or a solder ball can be used.

In the case where the semiconductor packages PK1 and PK2 are coupled to each other through the protruding electrodes 13, metal bonding such as solder bonding and alloy bonding may be used. Otherwise, pressure bonding such as ACF bonding, Nonconductive Film (NCF) bonding, Anisotropic Conductive Paste (ACP) bonding, and Nonconductive Paste (NCP) bonding may be used. Although described was a method where ACF bonding is used when the semiconductor chip 3 is flip-chip mounted on the carrier substrate 1 through the protruding electrodes 4, in the above-described embodiment, pressure bonding such as NCF bonding, ACP bonding, and NCP bonding may be used, otherwise metal bonding such as solder bonding and alloy bonding may be used.

FIGS. 2A–2D are sectional views showing one example of a method of manufacturing the semiconductor device of FIG. 1.

Figure 2A:
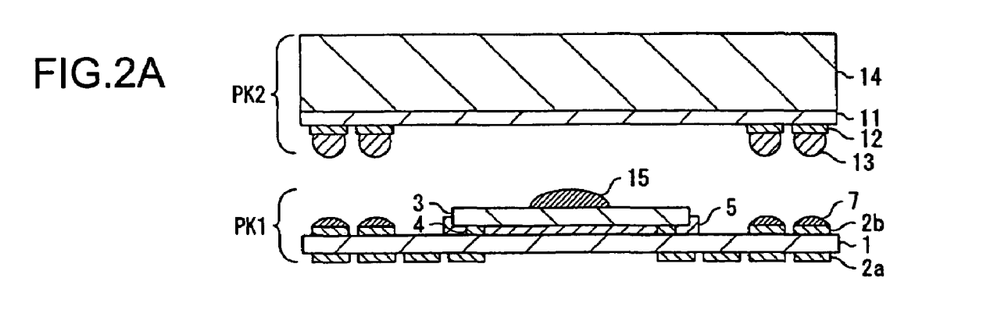
FIGS. 2A–2D are sectional views showing one example of a method of manufacturing the semiconductor device of FIG. 1.

Referring to FIG. 2A, in the case where the semiconductor package PK2 is to be stacked on the semiconductor package PK1, solder balls are formed on the lands 12 of the semiconductor package PK2 as the protruding electrodes 13, and flux 7 is provided on the lands 2b of the carrier substrate 1. The resin 15 is provided on the semiconductor chip 3 by using a dispenser and the like. By providing the resin 15 on the semiconductor chip 3 before the semiconductor package PK2 is stacked on the semiconductor package PK1, the resin 15 can easily be provided only on a particular area on the semiconductor chip 3 even in the case where the interval between the semiconductor packages PK1 and PK2 during stacking is narrow.

Figure 2B:
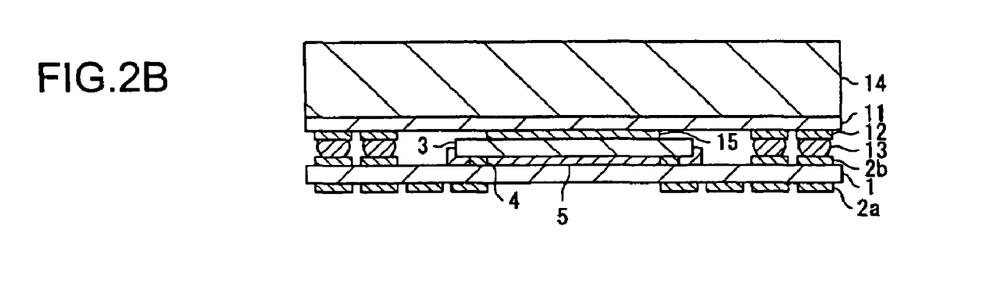

Next, the semiconductor package PK2 is mounted on the semiconductor package PK1 as shown in FIG. 2B. Then, the protruding electrodes 13 are melted by implementing a reflow process for the protruding electrodes 13, so as to bond the protruding electrodes 13 onto the lands 2b.

Here, when the protruding electrodes 13 are bonded onto the lands 2b, the resin 15 is preferably maintained at the A-stage state or the B-stage state. This enables the protruding electrodes 13 to be disposed on the lands 2b in a self-aligned manner by the surface tension of the protruding electrodes 13 when melted such that the semiconductor package PK2 can precisely be disposed on the semiconductor package PK1. Then, after the protruding electrodes 13 are bonded onto the lands 2b, the resin 15 is cured at a temperature lower than that during the reflow of the protruding electrodes 13, so as to transform the resin 15 into a C-stage state (a cured state).

By disposing the resin 15 on the semiconductor chip 3 so that at least a part of the semiconductor chip 3 is exposed, the semiconductor packages PK1 and PK2 are secured to each other through the semiconductor chip 3 while channels for letting out water contained in the resin 15 is ensured such that the residual volume of water contained in the resin 15 can be reduced.

Figure 2C:
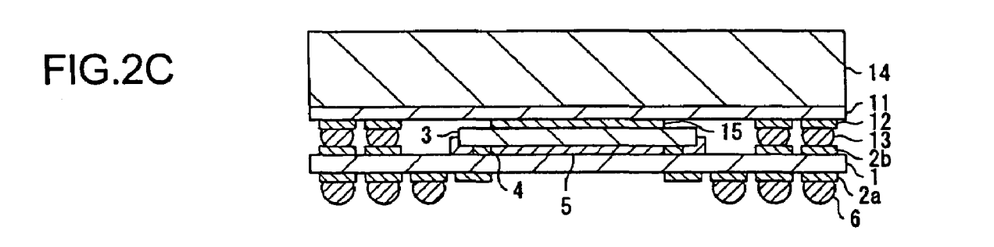

Next, the protruding electrodes 6 for mounting the carrier substrate 1 on a motherboard 8 are formed on the lands 2a, which are provided on a back surface of the carrier substrate 1, as shown in FIG. 2C.

Figure 2D:
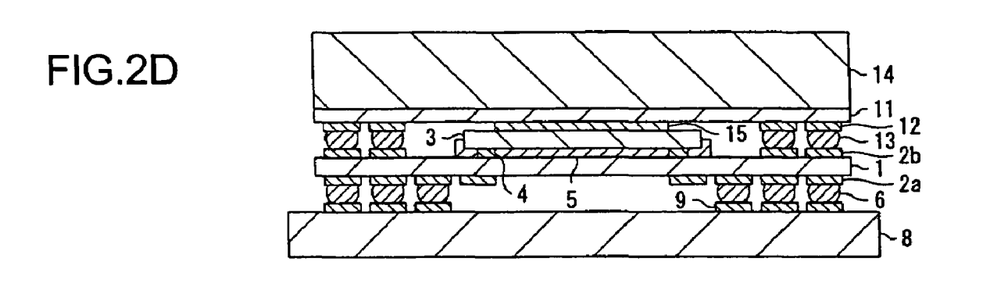

Then, the carrier substrate 1 where the protruding electrodes 6 are formed is mounted on the motherboard 8 as shown in FIG. 2D. Then, the protruding electrodes 6 are bonded onto the lands 9 of the motherboard 8 by implementing a reflow process for the protruding electrodes 6.

The reflow process for the protruding electrodes 6 can be implemented after water contained in the resin 15 between the semiconductor packages PK1 and PK2 has been almost completely removed, since the resin 15 is provided on the semiconductor chip 3 so that at least a part of the semiconductor 13 is exposed. The resin 15 therefore can be prevented from expanding during the reflow of the protruding electrodes 6, enabling the separation between the semiconductor packages PK1 and PK2 to be avoided. Even in the case where the protruding electrodes 13 are reflowed again during the reflow of the protruding electrodes 6, the semiconductor packages PK1 and PK2 can be still fixed to each other with the resin 15, enabling the displacement between the semiconductor packages PK1 and PK2 to be avoided.

In the above-described embodiment, described was a method where the flux 7 is provided on the lands 2b of the carrier substrate 1, and the protruding electrodes 13 are provided on the lands 12 of the carrier substrate 11 in order to mount the semiconductor package PK2 on the semiconductor package PK1. Instead of this, the protruding electrodes 13 may be provided on the lands 2b of the carrier substrate 1 while the flux 7 may be provided on the lands 12 of the carrier substrate 11. In addition, although described was a method where the resin 15 of a paste state is provided on the semiconductor chip 3 by using a dispenser and the like in the embodiment, the resin 15 of a sheet state may be provided on the semiconductor chip 3. A solder past may be provided onto the lands 2b of the carrier substrate 1.

Figure 3:
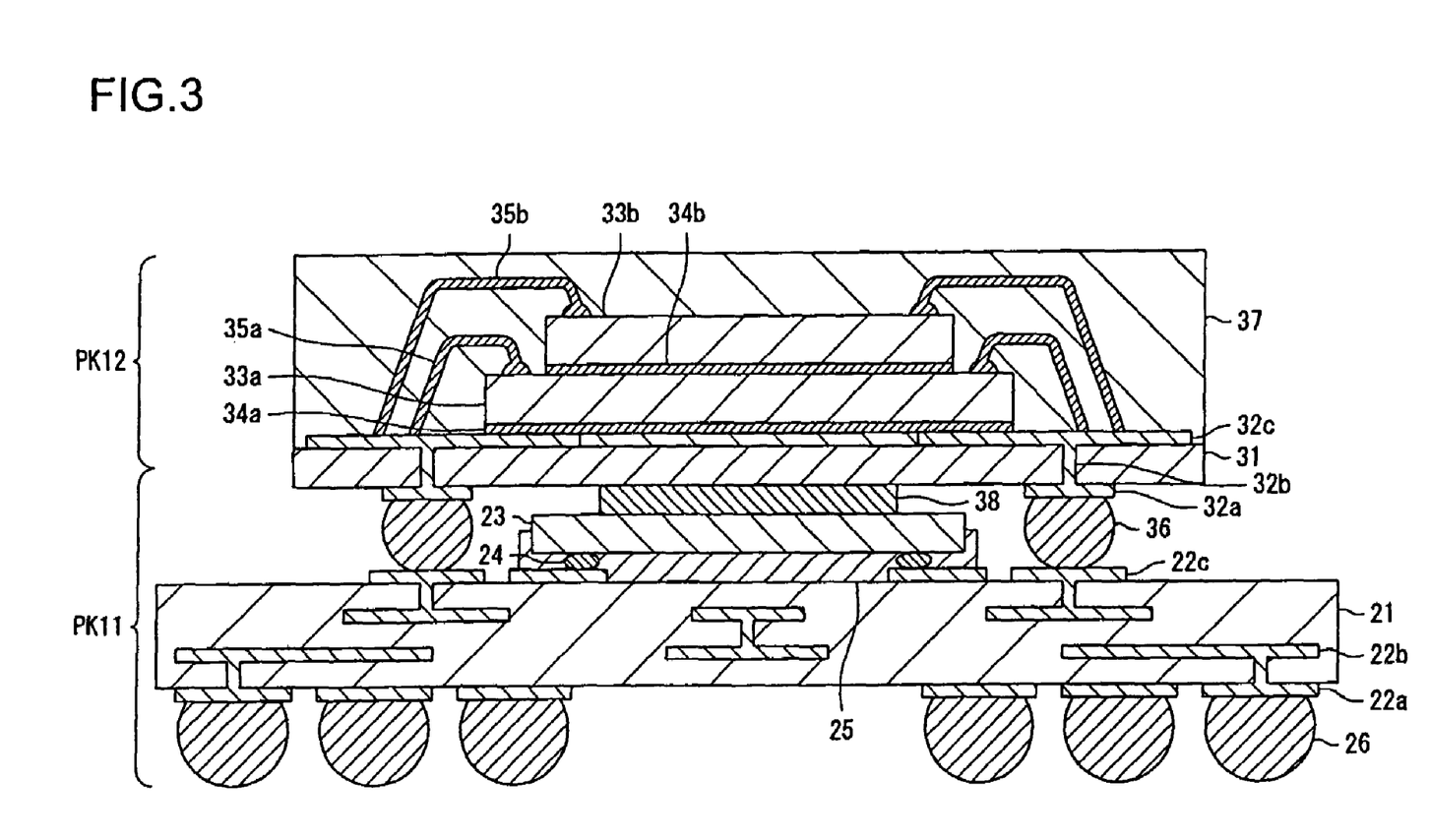
FIG. 3 is a sectional view schematically showing a structure of a semiconductor device according to a second embodiment of the present invention.

FIG. 3 is a sectional view schematically showing a structure of a semiconductor device according to a second embodiment of the present invention.

Referring to FIG. 3, a semiconductor package PK11 includes a carrier substrate 21. Lands 22a and 22c are formed on both sides of the carrier substrate 21, respectively, and an internal wiring 22b is formed inside the carrier substrate 21. A semiconductor chip 23 is flip-chip mounted on the carrier substrate 21. Protruding electrodes 24 for flip-chip mounting are provided on the semiconductor chip 23. The protruding electrodes 24 provided on the semiconductor chip 23 are bonded to the lands 22c through an anisotropic conductive sheet 25 by ACF bonding. On the lands 22a provided on a back surface of the carrier substrate 21, provided are protruding electrodes 26 for mounting the carrier substrate 21 on a motherboard.

Meanwhile, a semiconductor package PK12 includes a carrier substrate 31. Lands 32a and 32c are formed on both sides of the carrier substrate 31, respectively, and an internal wiring 32b is formed inside the carrier substrate 31. A semiconductor chip 33a is face-up mounted on the carrier substrate 31 through an adhesive layer 34a. The semiconductor chip 33a is wire-bonded to the lands 32c through conductive wires 35a. Furthermore, a semiconductor chip 33b is face-up mounted on the semiconductor chip 33a, avoiding the conductive wires 35a. The semiconductor chip 33b is fixed on the semiconductor chip 33a through an adhesive layer 34b and is wire-bonded to the lands 32c through conductive wires 35b.

On the lands 32a provided on a back surface of the carrier substrate 31, provided are protruding electrodes 36 for mounting the carrier substrate 31 on the carrier substrate 21 so that the carrier substrate 31 is held above the semiconductor chip 23. The protruding electrodes 36 are disposed avoiding the area where the semiconductor chip 23 is mounted. For example, the protruding electrodes 36 may be disposed on the periphery of the back surface of the carrier substrate 31. The carrier substrate 31 is mounted on the carrier substrate 21 by bonding the protruding electrodes 36 to the lands 22c provided on the carrier substrate 21.

Sealing resin 37 is provided on the surface of the carrier substrate 31 where the semiconductor chips 33a and 33b are mounted. The semiconductor chips 33a and 33b are sealed by the sealing resin 37. Here, when the semiconductor chips 33a and 33b are sealed by the sealing resin 37, for example, mold forming using thermosetting resin such as epoxy resin is available.

Resin 38 is provided on the semiconductor chip 23 so that at least a part of the semiconductor chip 23 is exposed. The semiconductor package PK12 is secured to the semiconductor chip 23 through the resin 38. Here, in the case where the resin 38 is provided on the semiconductor chip 23 so that at least a part of the semiconductor chip 23 is exposed, the resin 38 can be disposed on the semiconductor chip 23 before the semiconductor packages PK11 and PK12 are electrically coupled to each other through the protruding electrodes 36. In addition, when the semiconductor packages PK11 and PK12 are electrically coupled to each other through the protruding electrodes 38, the resin 38 disposed on the semiconductor chip 23 is preferably maintained at the A-stage state or the B-stage state.

Thus, even in the case where the types or sizes of the semiconductor packages PK11 and PK12 are different from each other, the separation between the semiconductor packages PK11 and PK12 can be avoided while the displacement of the semiconductor packages PK11 and PK12, which are stacked, during a secondary mounting is prevented. Furthermore, the semiconductor package PK12 can precisely be disposed above the semiconductor package PK11 utilizing self-alignment such that the reliability of the connection between the semiconductor packages PK11 and PK12 can be improved while space-saving is achieved.

Figure 4:
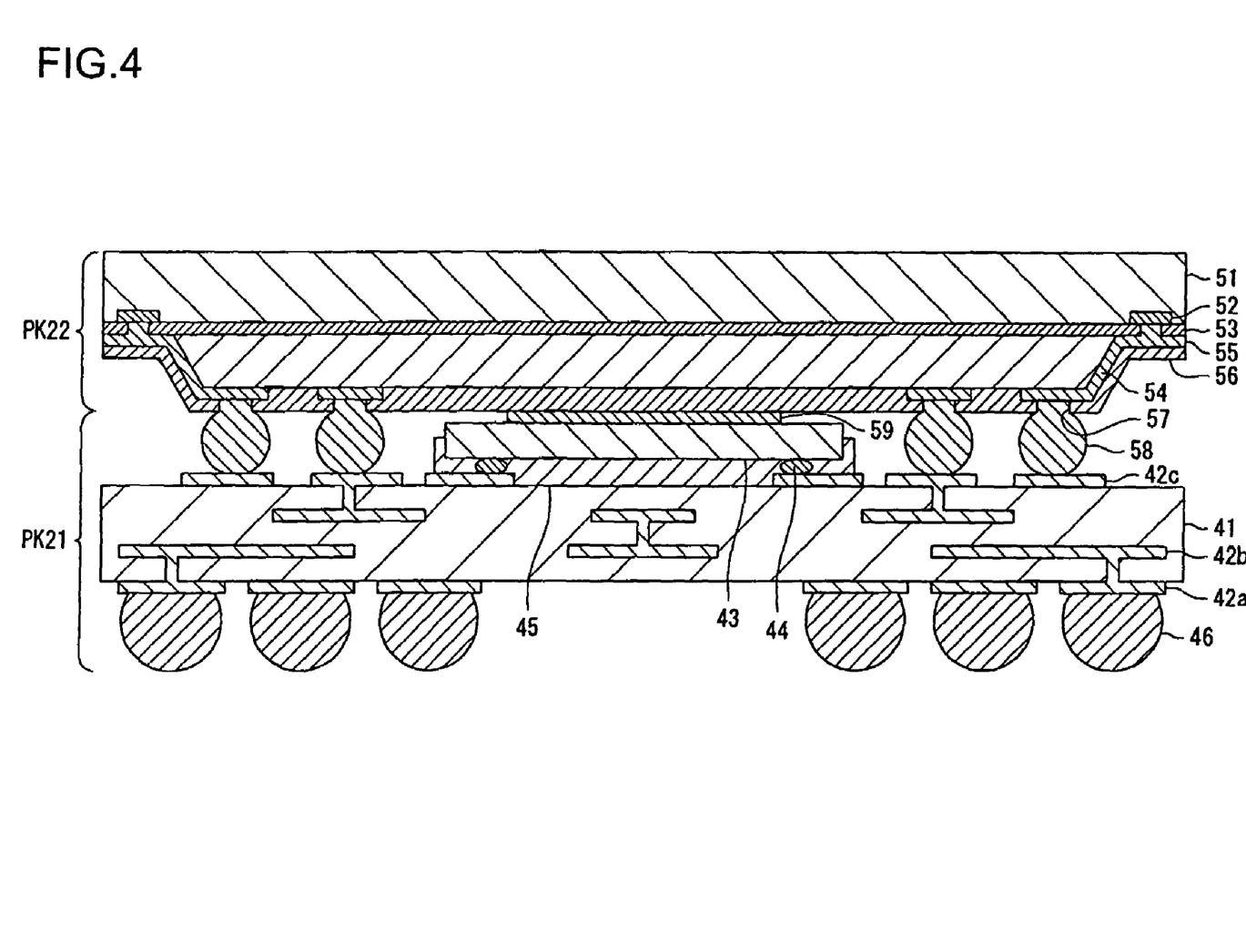
FIG. 4 is a sectional view schematically showing a structure of a semiconductor device according to a third embodiment of the present invention.

FIG. 4 is a sectional view schematically showing a structure of a semiconductor device according to a third embodiment of the present invention.

Referring to FIG. 4, a semiconductor package PK21 includes a carrier substrate 41. Lands 42a and 42c are formed on both sides of the carrier substrate 41, respectively, and an internal wiring 42b is formed inside the carrier substrate 41. A semiconductor chip 43 is flip-chip mounted on the carrier substrate 41. Protruding electrodes 44 for flip-chip mounting are provided on the semiconductor chip 43. The protruding electrodes 44 provided on the semiconductor chip 43 are bonded to the lands 42c through an anisotropic conductive sheet 45 by ACF bonding. On the lands 42a provided on a back surface of the carrier substrate 41, provided are protruding electrodes 46 for mounting the carrier substrate 41 on a motherboard.

Meanwhile, a semiconductor package PK22 includes a carrier substrate 51. To the semiconductor chip 51, provided are electrode pads 52, and provided is an insulating film 53 so that the electrode pads 52 are exposed. A stress relieving layer 54 is formed on the semiconductor chip 51 so that the electrode pads 52 are exposed. A rewiring 55 extended on the stress relieving layer 54 is formed on the electrode pads 52. A solder resist film 56 is formed on the rewiring 55, and openings 57 for exposing the rewiring 55 on the stress relieving layer 54 are formed in the solder resist film 56. Protruding electrodes 58 for face-down mounting the semiconductor chip 51 on the carrier substrate 41 are provided on the rewiring 55 exposed through the openings 57 so that the semiconductor package PK22 is held above the semiconductor chip 43.

The protruding electrodes 58 are disposed avoiding the area where the semiconductor chip 43 is mounted. For example, the protruding electrodes 58 may be disposed on the periphery of the semiconductor chip 51. The protruding electrodes 58 are bonded onto the lands 42c provided on the carrier substrate 41 so as to mount the semiconductor package PK22 on the carrier substrate 41.

Resin 59 is provided on the semiconductor chip 43 so that at least a part of the semiconductor chip 43 is exposed. The semiconductor package PK22 is secured to the semiconductor chip 43 through the resin 59. Here, in the case where the resin 59 is provided on the semiconductor chip 43 so that at least a part of the semiconductor chip 43 is exposed, the resin 59 can be disposed on the semiconductor chip 43 before the semiconductor packages PK21 and PK22 are electrically coupled to each other through the protruding electrodes 58. In addition, when the semiconductor packages PK21 and PK22 are electrically coupled to each other through the protruding electrodes 58, the resin 59 disposed on the semiconductor chip 43 is preferably maintained at the A-stage state or the B-stage state.

Thus, even in the case where a Wafer level-Chip Size Package (W-CSP) is stacked on the semiconductor package PK21, the separation between the semiconductor packages PK21 and PK22 can be avoided while the displacement of the semiconductor packages PK21 and PK22, which are stacked, during a secondary mounting is prevented. Furthermore, the semiconductor package PK22 can precisely be disposed above the semiconductor package PK21 utilizing self-alignment. As a result, even in the case where the types or sizes of the semiconductor chips 43 and 51 are different from each other, the semiconductor chip 51 can be three-dimensionally mounted above the semiconductor chip 43 without interposing a carrier substrate between the semiconductor chips 43 and 51. This enables the reliability of the semiconductor chips 43 and 51, which are three-dimensionally mounted, to be improved while space-saving when mounting the semiconductor chips 43 and 51 is achieved.

Figure 5:
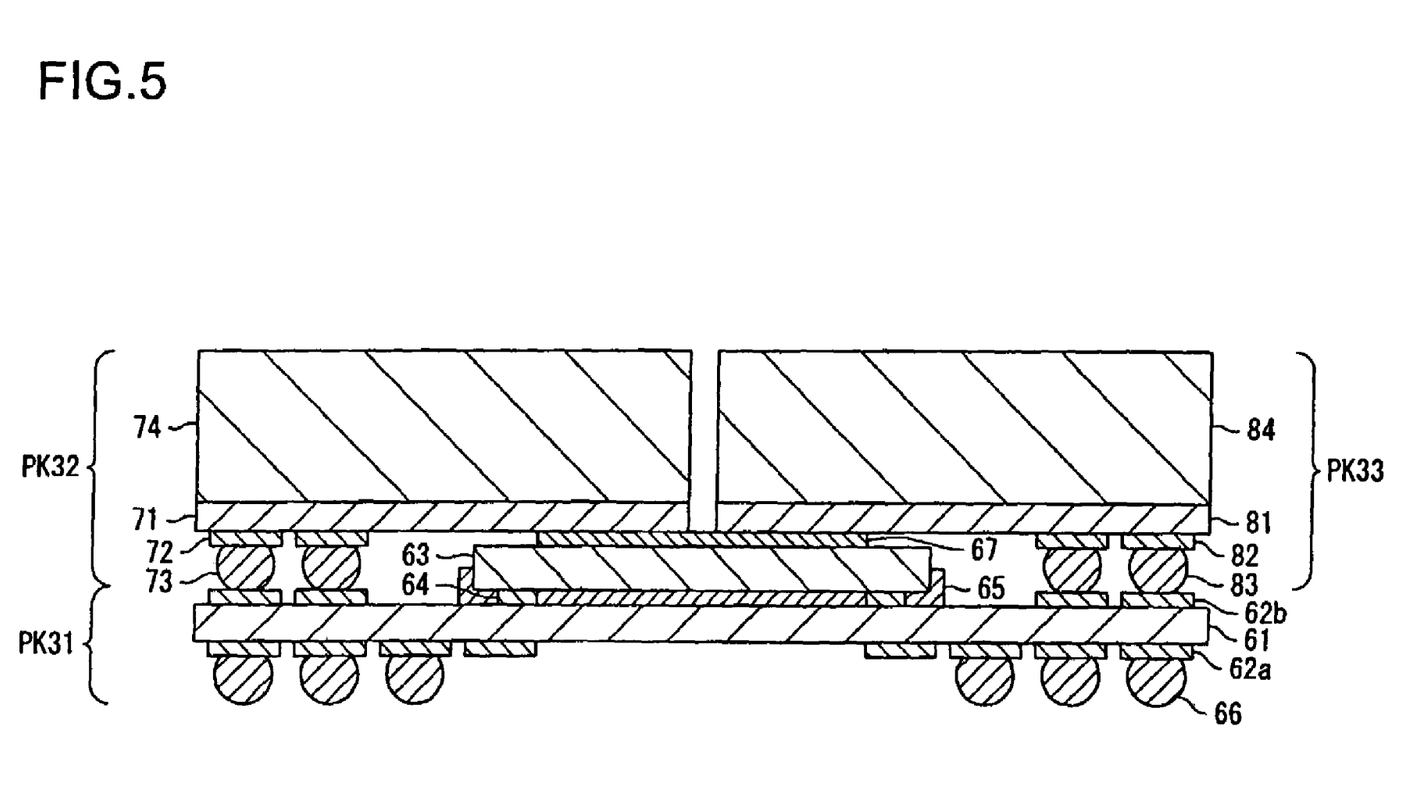
FIG. 5 is a sectional view schematically showing a structure of a semiconductor device according to a fourth embodiment of the present invention.

FIG. 5 is a sectional view schematically showing a structure of a semiconductor device according to a fourth embodiment of the present invention.

Referring to FIG. 5, a semiconductor package PK31 includes a carrier substrate 61, and on both sides of the carrier substrate 61 formed are lands 62a and 62b, respectively. A semiconductor chip 63 is flip-chip mounted on the carrier substrate 61. Protruding electrodes 64 for flip-chip mounting are provided on the semiconductor chip 63. The protruding electrodes 64 provided on the semiconductor chip 63 are bonded to the lands 62b through an anisotropic conductive sheet 65 by ACF bonding.

Meanwhile, semiconductor packages PK32 and PK33 include carrier substrates 71 and 81, respectively. Lands 72 and 82 are formed on back surfaces of the carrier substrates 71 and 81, and protruding electrodes 73 and 83 such as solder balls are provided on the lands 72 and 82, respectively. A semiconductor chip is mounted on each of the carrier substrates 71 and 81. The carrier substrates 71 and 81, where the semiconductor chip is mounted, are sealed with sealing resin 74 and 84, respectively.

Then, the protruding electrodes 73 and 83 each are bonded to the lands 62b provided on the carrier substrate 61, and thereby the plurality of semiconductor packages (the semiconductor packages PK32 and PK33) is mounted on the semiconductor package PK31 so that each of the end parts of the carrier substrates 71 and 81 is disposed above the semiconductor chip 63.

Resin 67 is provided on the semiconductor chip 63 so that at least a part of the semiconductor chip 63 is exposed. The end parts of the semiconductor packages PK32 and PK33 are secured to the semiconductor chip 63 through the resin 67. Here, in the case where the resin 67 is provided on the semiconductor chip 63 so that at least a part of the semiconductor chip 63 is exposed, the resin 67 can be disposed on the semiconductor chip 63 before the semiconductor package PK31 is electrically coupled to the semiconductor packages PK32 and PK33 through the protruding electrodes 73 and 83, respectively. In addition, when the semiconductor package PK31 is electrically coupled to the semiconductor packages PK32 and PK33 through the protruding electrodes 73 and 83, respectively, the resin 67 disposed on the semiconductor chip 63 is preferably maintained at the A-stage state or the B-stage state.

This enables the separation between the semiconductor package PK31 and the semiconductor packages PK32 and PK33 to be avoided while preventing the displacement of the semiconductor packages PK31, PK32, and PK33 during secondary mounting. In addition, the plurality of semiconductor packages (the semiconductor packages PK32 and PK33) can be disposed above one semiconductor chip (the semiconductor chip 63), and the semiconductor packages PK32 and PK33 can precisely be disposed above the semiconductor package PK31 utilizing self-alignment. Thus, the semiconductor packages PK32 and PK33 can precisely be disposed above the semiconductor package PK31 with achieving space-saving, while the reliability of the semiconductor packages PK31, PK32, and PK33 can be improved.

Here, in the case where the resin 67 is provided between the semiconductor chip 63 and each of the semiconductor packages PK32 and PK33, each of the semiconductor packages PK32 and PK33 may be disposed on the semiconductor chip 63 after the resin 67 is provided on the semiconductor chip 63. Otherwise, the resin 67 may be provided on the semiconductor chip 63 through the gap between the semiconductor packages PK32 and PK33 after each of the semiconductor packages PK32 and PK33 is disposed on the semiconductor chip 63.

Figure 6:
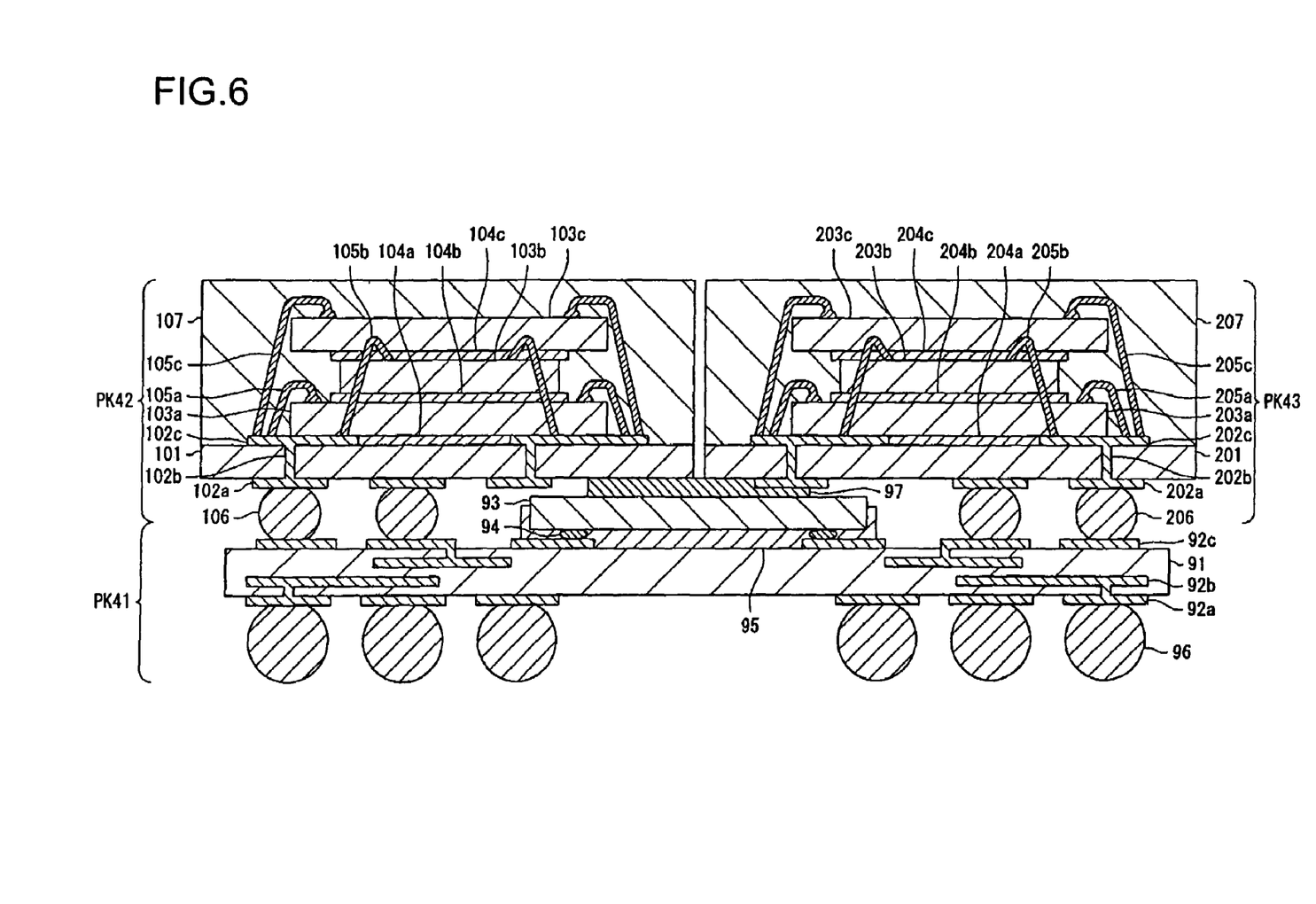
FIG. 6 is a sectional view schematically showing a structure of a semiconductor device according to a fifth embodiment of the present invention.

FIG. 6 is a sectional view schematically showing a structure of a semiconductor device according to a fifth embodiment of the present invention.

Referring to FIG. 6, a semiconductor package PK41 includes a carrier substrate 91. Lands 92a and 92c are formed on both sides of the carrier substrate 91, respectively, and an internal wiring 92b is formed inside the carrier substrate 91. A semiconductor chip 93 is flip-chip mounted on the carrier substrate 91. Protruding electrodes 94 for flip-chip mounting are provided on the semiconductor chip 93. The protruding electrodes 94 provided on the semiconductor chip 93 are bonded to the lands 92c through an anisotropic conductive sheet 95 by ACF bonding. On the lands 92a provided on a back surface of the carrier substrate 91, provided are protruding electrodes 96 for mounting the carrier substrate 91 on a motherboard.

Meanwhile, semiconductor packages PK42 and PK43 include carrier substrates 101 and 201, respectively. Lands 102a and 202a are formed on back surfaces of the carrier substrates 101 and 201, respectively. Lands 102c and 202c are formed on front surfaces of the carrier substrates 101 and 201, respectively. Internal wirings 102b and 202b are formed inside the carrier substrates 101 and 201, respectively.

Semiconductor chips 103a and 203a are face-up mounted on the carrier substrates 101 and 201 through adhesive layers 104a and 204a, respectively. The semiconductor chips 103a and 203a are wire-bonded to the lands 102c and 202c through conductive wires 105a and 205a, respectively. Furthermore, semiconductor chips 103b and 203b are face-up mounted on the semiconductor chips 103a and 203a, avoiding the conductive wires 105a and 205a, respectively. The semiconductor chips 103b and 203b are fixed on the semiconductor chips 103a and 203a through adhesive layers 104b and 204b and are wire-bonded to the lands 102c and 202c through conductive wires 105b and 205b. In addition, semiconductor chips 103c and 203c are face-up mounted on the semiconductor chips 103b and 203b, avoiding the conductive wires 105b and 205b, respectively. The semiconductor chips 103c and 203c are fixed on the semiconductor chips 103b and 203b through adhesive layers 104c and 204c and are wire-bonded to the lands 102c and 202c through conductive wires 105c and 205c.

On the lands 102a and 202a provided on back surfaces of the carrier substrates 101 and 201, provided are protruding electrodes 106 and 206 for mounting the carrier substrates 101 and 201 on the carrier substrate 91 so that each of the carrier substrates 101 and 201 is held above the semiconductor chip 93. The protruding electrodes 106 and 206 are preferably disposed on at least four corners of the carrier substrates 101 and 201, respectively. For example, the protruding electrodes 106 and 206 may be disposed in a U-shape.

Then, the protruding electrodes 106 and 206 each are bonded to the lands 92c provided on the carrier substrate 91, and thereby each of the carrier substrates 101 and 201 can be mounted on the carrier substrate 91 so that each of the end parts of the carrier substrates 101 and 201 is disposed above the semiconductor chip 93.

Sealing resin 107 and 207 is provided on the surfaces of the carrier substrates 101 and 201 where the semiconductor chips 103a through 103c, and 203a through 203c are mounted, respectively. The semiconductor chips 103a through 103c, and 203a through 203c are sealed by the sealing resin 107 and 207.

Resin 97 is provided on the semiconductor chip 93 so that at least a part of the semiconductor chip 93 is exposed. End of the parts of the semiconductor packages PK42 and PK43 are secured to the semiconductor chip 93 through the resin 97. Here, in the case where the resin 97 is provided on the semiconductor chip 93 so that at least a part of the semiconductor chip 93 is exposed, the resin 97 can be disposed on the semiconductor chip 93 before the semiconductor package PK41 is electrically coupled to the semiconductor packages PK42 and PK43 through the protruding electrodes 106 and 206, respectively. In addition, when the semiconductor package PK41 is electrically coupled to the semiconductor packages PK42 and PK43 through the protruding electrodes 106 and 206, respectively, the resin 97 disposed on the semiconductor chip 93 is preferably maintained at the A-stage state or the B-stage state.

Thus, the plurality of semiconductor packages (the semiconductor packages PK42 and PK43) can be disposed above one semiconductor chip (the semiconductor chip 93) such that the semiconductor chips 93, 103a through 103c, and 203a through 203c of different types can be three-dimensionally mounted while the mounting area can be reduced. In addition, the displacement of the semiconductor packages PK41, PK42, and PK43 during secondary mounting can be avoided while the separation between the semiconductor packages PK42 and PK43, and the semiconductor package PK41 can be prevented. Meanwhile, even in the case where the resin 97 is disposed on the semiconductor chip 93 before the semiconductor packages PK42 and PK43 are disposed above the semiconductor package PK41, the fluidity of the resin 97 provided between the semiconductor package PK41 and the semiconductor packages PK42 and PK43 can be maintained when the semiconductor packages PK42 and PK43 are electrically coupled to the semiconductor package PK41 through the protruding electrodes 106 and 206, respectively. Thus, self-alignment by the surface tension of solder when melted can be utilized when solder balls are used as the protruding electrodes 106 and 206 such that the semiconductor packages PK42 and PK43 each can precisely be disposed above the semiconductor package PK41.

The above-described semiconductor device can be applied to, for example, electronic equipment such as a liquid crystal display, a cellular phone, a portable information terminal, a video camera, a digital camera, a Mini Disc (MD) player so as to improve the reliability of the electronic equipment with reducing the size and weight of the electronic equipment.

Although a method of stacking semiconductor packages was described by way of example in the above-described embodiments, the present invention is not necessarily limited to a method of stacking semiconductor packages but may be applied to a method of stacking, for example, ceramic elements such as surface acoustic wave (SAW) elements, optical elements such as optical modulators and optical switches, and sensors of various types such as magnetic sensors and bio sensors.

What is claimed is:

1. A method of manufacturing a semiconductor device, comprising:
   (a) preparing a first semiconductor package including a carrier substrate and a first semiconductor chip mounted on the carrier substrate through an adhesive the first semiconductor chip including a first surface and a second surface, the first surface opposite to the second surface, the second surface facing the carrier substrate;
   (b) providing resin on a part of the first surface of the first semiconductor chip, a modulus of elasticity of the resin is smaller than that of the adhesive;
   (c) coupling a second semiconductor package where a second semiconductor chip is mounted to the first semiconductor package electrically with reflowing a protruding electrode disposed between the first semiconductor package and the second semiconductor package at a first temperature while the resin maintains its fluidity; and
   (d) transforming the resin into a C-stage state at a second temperature after the step (c), the second temperature is lower than the first temperature.

2. The method of manufacturing a semiconductor device according to claim 1, wherein the protruding electrode is a solder ball.

3. The method of manufacturing a semiconductor device according to claim 1, wherein the state where the resin maintains its fluidity is either of an A-stage state or a B-stage state.

4. A method of manufacturing a semiconductor device, comprising:
   (a) preparing a first semiconductor package including a carrier substrate and a first semiconductor chip mounted on the carrier substrate through an adhesive the first semiconductor chip including a first surface and a second surface, the first surface opposite to the second surface, the second surface facing the carrier substrate;
   (b) providing resin on a partial area of the first surface of the first semiconductor chip, a modulus of elasticity of the resin is smaller than that of the adhesive;
   (c) coupling a second semiconductor package where a second semiconductor chip is mounted to the first semiconductor package electrically so that the second semiconductor package is disposed above the first semiconductor chip with reflowing a protruding electrode disposed between the first semiconductor package and the second semiconductor package at a first temperature while the resin maintains its fluidity; and
   (d) transforming the resin into a C-stage state at a second temperature after the step (c), the second temperature is lower than the first temperature.

5. The method of manufacturing a semiconductor device according to claim 4, wherein the protruding electrode is a solder ball.

6. The method of manufacturing a semiconductor device according to claim 4, wherein the state where the resin maintains its fluidity is either of an A-stage state or a B-stage state.

7. A method of manufacturing a semiconductor device, comprising:
   (a) preparing a first semiconductor package including a carrier substrate and a first semiconductor chip mounted on the carrier substrate through an adhesive, the first semiconductor chip including a first surface and a second surface, the first surface opposite to the second surface, the second surface facing the carrier substrate;
   (b) providing resin on a partial area of the first surface of the first semiconductor chip, a modulus of elasticity of the resin is smaller than that of the adhesive; and
   (c) coupling a second semiconductor package where a second semiconductor chip is mounted to the first semiconductor package electrically so that an end part of the second semiconductor package is disposed above the first semiconductor chip with reflowing a protruding electrode disposed between the first semiconductor package and the second semiconductor package at a first temperature while the resin maintains its fluidity; and
   (d) transforming the resin into a C-stage state at a second temperature after the step (c), the second temperature is lower than the first temperature.

8. The method of manufacturing a semiconductor device according to claim 7, wherein the protruding electrode is a solder ball.

9. The method of manufacturing a semiconductor device according to claim 7, wherein the state where the resin maintains its fluidity is either of an A-stage state or a B-stage state.

10. A method of manufacturing an electronic device, comprising:
    (a) preparing a first package including a carrier substrate and a first electronic component mounted on the carrier substrate through an adhesive, the first electronic component including a first surface and a second surface, the first surface opposite to the second surface, the second surface facing the carrier substrate;
    (b) providing resin on a partial area of the first surface of the first electronic component, a modulus of elasticity of the resin is smaller than that of the adhesive;
    (c) coupling a second package where a second electronic component is mounted to the first package electrically with reflowing a protruding electrode disposed between the first semiconductor package and the second semiconductor package at a first temperature while the resin maintains its fluidity; and
    (d) transforming the resin into a C-stage state at a second temperature after the step (c), the second temperature is lower than the first temperature.

11. The method of manufacturing a semiconductor device according to claim 10, wherein the state where the resin maintains its fluidity is either of an A-stage state or a B-stage state.

* * * * *